(12) United States Patent
Park et al.

(10) Patent No.: US 10,295,564 B2
(45) Date of Patent: May 21, 2019

(54) APPARATUS FOR CLAMPING A PROBE CARD AND PROBE CARD INCLUDING THE SAME

(71) Applicant: Samsung Electronics Co., Ltd., Suwon-si, Gyeonggi-do (KR)

(72) Inventors: Sung-Yong Park, Suwon-si (KR); Sang-Boo Kang, Hwaseong-si (KR); Jae-Geun Kim, Seoul (KR); Sung-Hyup Kim, Hwaseong-si (KR); Jeong-Min Na, Seoul (KR); Jae-Hyoung Park, Yongin-si (KR); Sang-Kyu Yoo, Hwaseong-si (KR); Jae-Hoon Joo, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 122 days.

(21) Appl. No.: 15/407,660

(22) Filed: Jan. 17, 2017

(65) Prior Publication Data

US 2018/0017595 A1    Jan. 18, 2018

(30) Foreign Application Priority Data

Jul. 18, 2016    (KR) .................. 10-2016-0090543

(51) Int. Cl.
*G01R 1/073* (2006.01)
*G01R 1/04* (2006.01)
*G01R 31/28* (2006.01)

(52) U.S. Cl.
CPC ........... *G01R 1/07342* (2013.01); *G01R 1/04* (2013.01); *G01R 31/2889* (2013.01)

(58) Field of Classification Search
CPC ............................. G01R 1/07342; G01R 1/04
See application file for complete search history.

(56) References Cited

U.S. PATENT DOCUMENTS

| 5,355,079 A | * | 10/1994 | Evans | ................ G01R 1/07342 |
| | | | | 324/755.05 |
| 5,884,395 A | * | 3/1999 | Dabrowiecki | ..... G01R 1/07342 |
| | | | | 29/592.1 |

(Continued)

FOREIGN PATENT DOCUMENTS

| JP | 4873083 B2 | 2/2012 |
| JP | 5099874 B2 | 12/2012 |

(Continued)

*Primary Examiner* — Tung X Nguyen
*Assistant Examiner* — Dominic E Hawkins
(74) *Attorney, Agent, or Firm* — Harness, Dickey & Pierce, P.L.C.

(57) ABSTRACT

An apparatus for clamping a probe card may include a body portion, an inner clamping portion and a plurality of outer clamping portions. The body portion may be arranged between a printed circuit board (PCB) of the probe card and a test head. The inner clamping portion may be integrally formed with an upper surface of the body portion. The inner clamping portion may be configured to affix a central portion of the PCB to the test head. The outer clamping portions may be integrally formed with side surfaces of the body portion. The outer clamping portions may be configured to affix a portion surrounding the central portion of the PCB to the test head. Thus, a contact area between the clamping apparatus and the PCB may be increased.

18 Claims, 15 Drawing Sheets

(56) References Cited

U.S. PATENT DOCUMENTS

| | | | |
|---|---|---|---|
| 7,285,968 B2* | 10/2007 | Eldridge | G01R 31/2863 |
| | | | 324/750.03 |
| 7,355,425 B2 | 4/2008 | Yamada | |
| 7,581,962 B2* | 9/2009 | Henry | G01R 1/0408 |
| | | | 439/525 |
| 8,120,375 B2 | 2/2012 | Foster et al. | |
| 8,278,956 B2* | 10/2012 | Losey | G01R 31/2889 |
| | | | 324/754.03 |
| 8,324,915 B2* | 12/2012 | Yasumura | G01R 31/2875 |
| | | | 324/750.03 |
| 8,427,183 B2 | 4/2013 | Mathieu et al. | |
| 8,710,855 B2 | 4/2014 | Namiki et al. | |
| 8,779,792 B2 | 7/2014 | Kim et al. | |
| 2007/0007979 A1* | 1/2007 | Noguchi | G01R 31/2889 |
| | | | 324/756.03 |
| 2007/0063719 A1* | 3/2007 | Yamada | G01R 1/0408 |
| | | | 324/750.19 |
| 2009/0146675 A1* | 6/2009 | Karklin | G01R 1/07364 |
| | | | 324/762.01 |
| 2012/0126843 A1 | 5/2012 | Shibahara | |
| 2014/0210501 A1* | 7/2014 | Root | G01R 31/2889 |
| | | | 324/750.19 |

FOREIGN PATENT DOCUMENTS

| | | |
|---|---|---|
| KR | 100903290 B1 | 6/2009 |
| KR | 100911661 B1 | 8/2009 |
| KR | 101016383 B1 | 2/2011 |
| KR | 101181639 B1 | 9/2012 |

* cited by examiner

APPARATUS FOR CLAMPING A PROBE CARD AND PROBE CARD INCLUDING THE SAME

CROSS-RELATED APPLICATION

This application claims priority under 35 USC § 119 to Korean Patent Application No. 2016-90543, filed on Jul. 18, 2016 in the Korean Intellectual Property Office (KIPO), the contents of which are herein incorporated by reference in their entirety.

BACKGROUND

Example embodiments relate to an apparatus for clamping a probe card and a probe card including the same. More particularly, example embodiments relate to an apparatus for clamping a printed circuit board of a probe card to a test head, and a probe card including the apparatus.

Generally, a probe card may be used for testing electrical characteristics of a semiconductor chip. The probe card may include a printed circuit board (PCB), a multi-layered substrate, needles and a clamping apparatus. The clamping apparatus may be configured to clamp the PCB to a test head. The needles may be provided to the multi-layered substrate. The needles may electrically make contact with the semiconductor chip.

SUMMARY

Example embodiments provide an apparatus for clamping a probe card that may be capable of improving a contact between needles and an object.

Example embodiments also provide a probe card including the above-mentioned apparatus.

According to example embodiments, there may be provided an apparatus for clamping a probe card. The apparatus may include a body portion, an inner clamping portion and a plurality of outer clamping portions. The body portion may be arranged between a printed circuit board (PCB) of the probe card and a test head. The inner clamping portion may be integrally, or continuously, formed with an upper surface of the body portion. The inner clamping portion may be configured to affix a central portion of the PCB to the test head. The outer clamping portions may be integrally formed with side surfaces of the body portion. The outer clamping portions may be configured to affix a portion of the PCB, which may be configured to surround the central portion of the PCB, to the test head.

According to example embodiments, there may be provided an apparatus for clamping a probe card. The apparatus may include an inner clamp, an outer clamp and at least one auxiliary clamp. The inner clamp may be arranged between a printed circuit board (PCB) of the probe card and a test head to affix a central portion of the PCB to the test head. The outer clamp is configured to surround the inner clamp to affix a portion of the PCB, which may be configured to surround the central portion of the PCB, to the test head. The auxiliary clamp may be extended from a side surface of the outer clamp. The auxiliary clamp may be arranged between the test head and a stiffener of the probe card.

According to example embodiments, there may be provided a probe card. The probe card may include a PCB, a multi-layered substrate, a plurality of needles and a clamping apparatus. The PCB may be arranged between an object and a test head. The multi-layered substrate may be arranged between the PCB and the object. The needles may be installed at the multi-layered substrate to make contact with the object. The clamping apparatus may include a body portion, an inner clamping portion and a plurality of outer clamping portions. The body portion may be arranged between a printed circuit board (PCB) of the probe card and a test head. The inner clamping portion may be integrally formed with an upper surface of the body portion. The inner clamping portion may be configured to affix a central portion of the PCB to the test head. The outer clamping portions may be integrally formed with side surfaces of the body portion. The outer clamping portions may be configured to affix a portion of the PCB, which may be configured to surround the central portion of the PCB, to the test head.

According to example embodiments, the inner clamping portion and the outer clamping portions may be integrally formed with the body portion so that a contact area between the clamping apparatus and the PCB may be increased. Thus, bending of the probe card including the PCB may be suppressed to improve contacts between the object and the needles on the edge portion of the multi-layered substrate. As a result, a normal semiconductor chip may not be determined to be abnormal.

BRIEF DESCRIPTION OF THE DRAWINGS

Example embodiments will be more clearly understood from the following detailed description taken in conjunction with the accompanying drawings. FIGS. 1 to 21 represent non-limiting, example embodiments as described herein.

FIG. 1 is an exploded perspective view illustrating a probe card in accordance with example embodiments;

FIG. 2 is a perspective view illustrating a clamping apparatus combined with a PCB of the probe card in FIG. 1;

FIG. 4 is a perspective view illustrating a bottom surface of the clamping apparatus in FIG. 3;

FIG. 5 is a cross-sectional view taken along a line V-V' in FIG. 3;

FIG. 6 is a cross-sectional view taken along a line VI-VI' in FIG. 3;

FIG. 7 is a perspective view illustrating the PCB clamped by the clamping apparatus in FIG. 2;

FIG. 8 is a perspective views illustrating a bottom surface of the clamping apparatus in FIG. 7;

FIG. 9 is a cross-sectional view taken along a line IX-IX' in FIG. 7;

FIG. 10 is a cross-sectional view taken along a line X-X' in FIG. 7;

FIG. 11 is a perspective view illustrating a clamping apparatus for a probe card in accordance with example embodiments;

FIG. 12 is a perspective view illustrating a bottom surface of the clamping apparatus in FIG. 11;

FIG. 13 is a perspective view illustrating a clamping apparatus for a probe card in accordance with example embodiments;

FIG. 14 is a perspective view illustrating a bottom surface of the clamping apparatus in FIG. 13;

FIG. 15 is a perspective view illustrating a clamping apparatus for a probe card in accordance with example embodiments;

FIG. 16 is a perspective view illustrating a clamping apparatus for a probe card in accordance with example embodiments;

FIG. 17 is a perspective view illustrating a bottom surface of the clamping apparatus in FIG. 16;

FIG. 18 is a perspective view illustrating a clamping apparatus for a probe card in accordance with example embodiments;

FIG. 19 is a perspective view illustrating a bottom surface of the clamping apparatus in FIG. 18;

FIG. 20 is a perspective view illustrating a clamping apparatus for a probe card in accordance with example embodiments; and FIG. 21 is a block diagram of a testing apparatus in accordance with example embodiments.

DETAILED DESCRIPTION

Hereinafter, example embodiments will be explained in detail with reference to the accompanying drawings.

Figure 1:
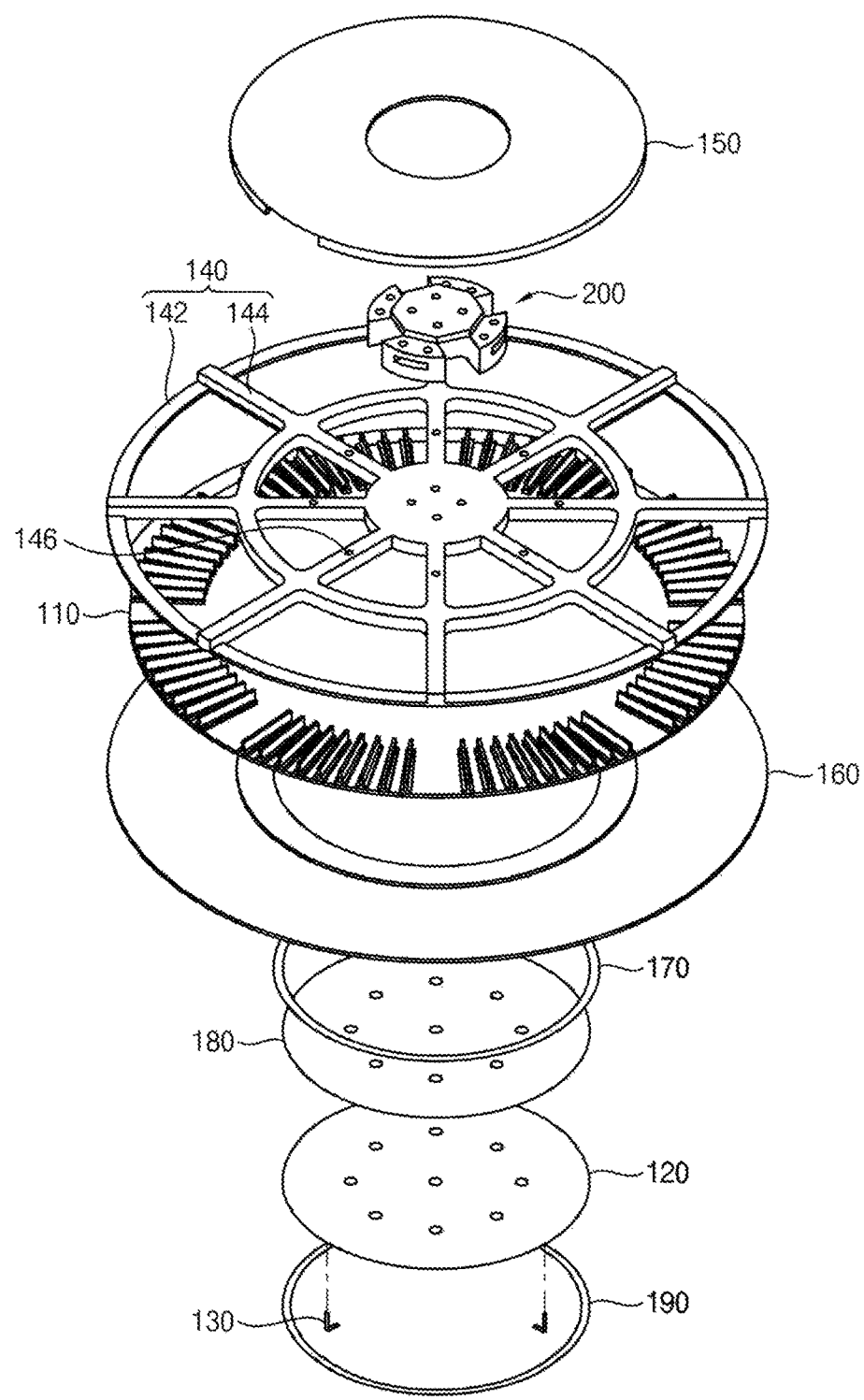

FIG. 1 is an exploded perspective view illustrating a probe card in accordance with example embodiments.

Referring to FIG. 1, a probe card of this example embodiment may include a printed circuit board (PCB) 110, a multi-layered substrate 120, a plurality of needles 130, a stiffener 140, an upper cover 150, a lower cover 160, an upper rim 170, a spacer 180, a lower rim 190 and a clamping apparatus 200.

Although not depicted in FIG. 1, the probe card may be arranged under a test head. The probe card may be arranged over a chuck configured to affix an object such as a semiconductor chip, or a wafer containing semiconductor chips. A test current in the test head may be supplied to the semiconductor chip through the probe card. The clamping apparatus 200 may be configured to fix the probe card to the test head.

The PCB 110 may be arranged between the test head and the semiconductor chip. The PCB 110 may include circuit patterns through which the test current may flow. The clamping apparatus 200 may be configured to affix the PCB 110 to the test head.

The multi-layered substrate 120 may be arranged between the PCB 110 and the semiconductor chip. The multi-layered substrate 120 may include a plurality of insulating substrates and conductive patterns formed in the insulating substrates. The conductive patterns of the multi-layered substrate 120 may be configured to be electrically connected with the circuit patterns of the PCB 110.

Although not depicted in drawings, a plurality of interposers may be arranged between the PCB 110 and the multi-layered substrate 120. At least one of the interposers may include pins configured to electrically connect the circuit patterns of the PCB 110 with the conductive patterns of the multi-layered substrate 120.

The upper rim 170 may be arranged between the PCB 110 and the multi-layered substrate 120. The upper rim 170 may have a structure configured to surround the interposers between the PCB 110 and the multi-layered substrate 120 to protect the pins of the interposers.

The spacer 180 may be arranged between the interposers and the multi-layered substrate 120. The spacer 180 may function as to uniformly maintain gaps between the interposers and the multi-layered substrate 120. The spacers 180 may have a plurality of holes through which the pins of the interposers may pass. Thus, the pins of the interposers may be electrically connected to the conductive patterns of the multi-layered substrate 120 through the holes of the spacers 180.

The needles 130 may be installed on a lower surface of the multi-layered substrate 120. The needles 130 may be electrically connected to the conductive patterns of the multi-layered substrate 120. The needles 130 may be configured to be electrically connected to external terminals of the semiconductor chip on the chuck.

The lower rim 190 may be arranged on the lower surface of the multi-layered substrate 120. The lower rim 190 may have a structure configured to surround the needles 130 to protect the needles 130.

The stiffener 140 may be arranged on an upper surface of the PCB 110. The stiffener 140 may include a plurality of rims 142 concentrically arranged, and connecting portions 144 radially extended from center points of the rims 142 to connect the rims 142 with each other. In example embodiments, the connecting portions 144 may include eight portions arranged at a substantially same angle. Numbers of the connecting portions 144 may be determined in accordance with structures and functions of the stiffener 140.

Adjusting screws 146 may be combined with the connecting portions 144 of the stiffener 140, with threads. When the probe card may be tilted, a tilted angle of the probe card may be corrected using an adjusting screw selected from the adjusting screws 146 to provide the probe card with horizontality.

The upper cover 150 may be configured to cover an upper surface of the stiffener 140. The upper cover 150 may have an opening configured to expose the clamping apparatus 200 arranged at a central portion of the stiffener 140.

The lower cover 160 may be configured to cover the lower surface of the PCB 110. The lower cover 150 may have an opening configured to expose the upper rim 170, the spacer 180, the multi-layered substrate 120 and the lower rim 190.

Figure 2:
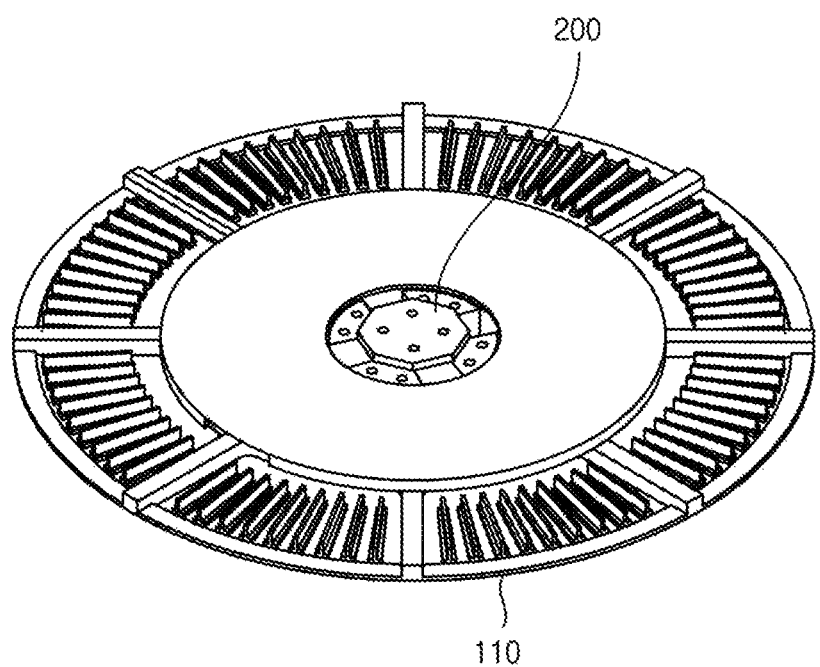

FIG. 2 is a perspective view illustrating a clamping apparatus combined with a PCB of the probe card in FIG. 1.

Referring to FIGS. 1 and 2, the clamping apparatus 200 may be arranged at the central portion of the stiffener 140 to affix the PCB 110 to the test head. A clamping force of the clamping apparatus 200 may be determined by a contact area between the clamping apparatus 200 and the PCB 110 through the stiffener 140. Therefore, the clamping force of the clamping apparatus 200 may be proportional to the contact area between the clamping apparatus 200 and the PCB 110.

Figure 3A:
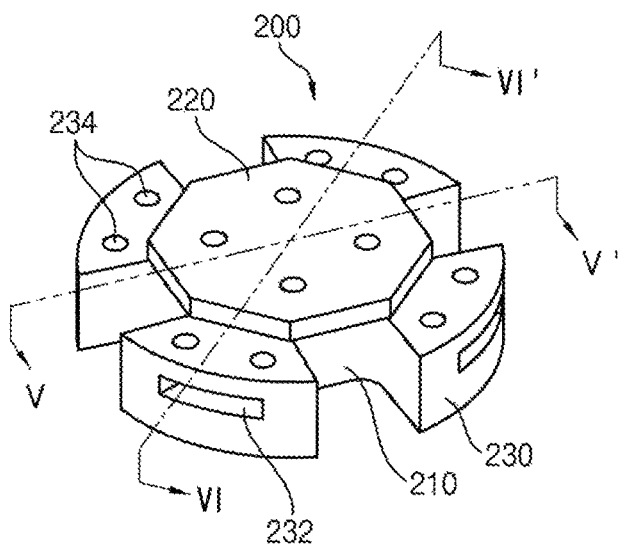
FIGS. 3A and 3B are perspective views illustrating the clamping apparatus in FIG. 1.
Figure 3B:
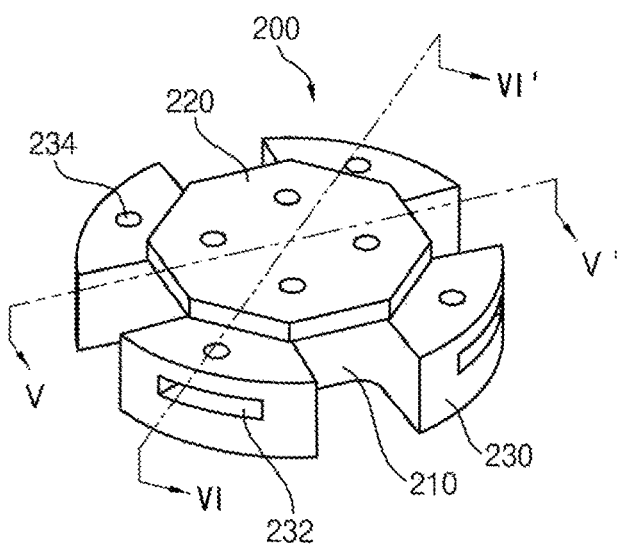
Figure 4:
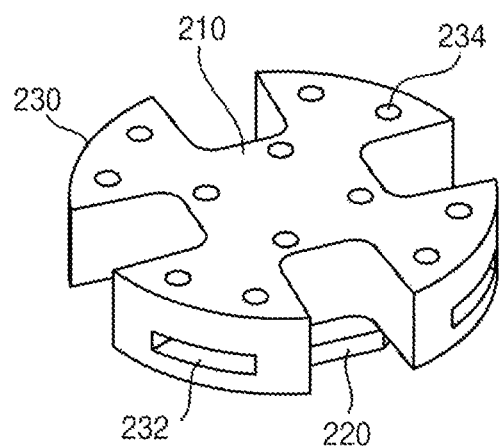
Figure 5:
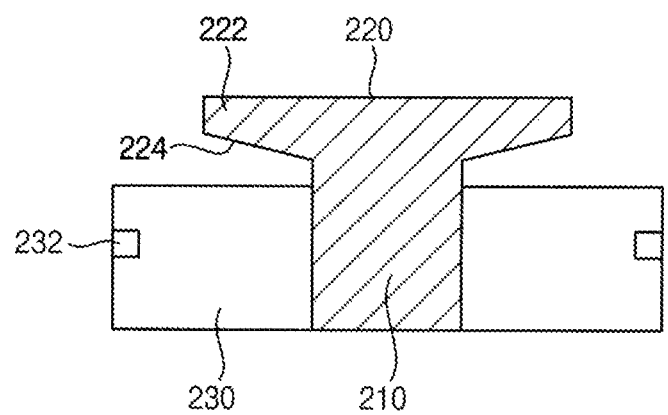
Figure 6:
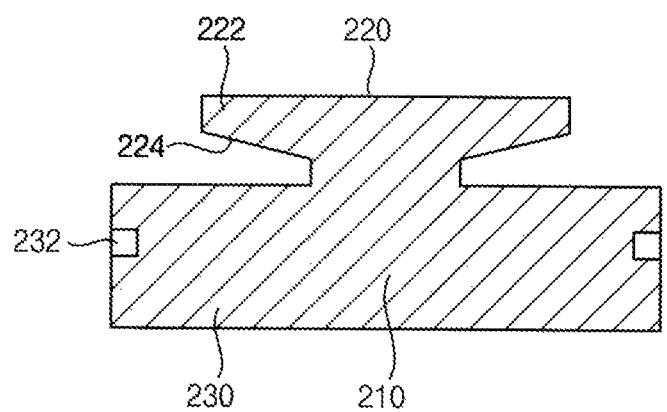

FIGS. 3A and 3B are perspective views illustrating the clamping apparatus in FIG. 1, FIG. 4 is a perspective view illustrating a bottom surface of the clamping apparatus in FIG. 3, FIG. 5 is a cross-sectional view taken along a line V-V' in FIG. 3, and FIG. 6 is a cross-sectional view taken along a line VI-VI' in FIG. 3.

Referring to FIGS. 3 to 6, the clamping apparatus 200 may include a body portion 210, an inner clamping portion 220 and a plurality of outer clamping portions 230. The inner clamping portion 220 and the outer clamping portions 230 may be formed integrally with the body portion 210. Thus, the inner clamping portion 220, the outer clamping portion 230, and the body portion 210 may be of one single piece.

The body portion 210 may be arranged on the central portion of the stiffener 140. The body portion 210 may be configured to support a central portion of the PCB 110 under the stiffener 140. In example embodiments, the body portion 210 may have a substantially parallelepiped shape. Thus, the body portion 210 may have four side surfaces. Alternatively, the body portion 210 may have other shapes such as a cylindrical shape.

The inner clamping portion 220 may be formed integrally with an upper surface of the body portion 210. The inner clamping portion 220 may be configured to clamp the central portion of the PCB 110 to the test head. The inner clamping portion 220 may have eight side surfaces. Alternatively, the inner clamping portion 220 may have two to seven side surfaces or at least nine side surfaces.

The inner clamping portion 220 may have a protrusion 222 horizontally protruded from the inner clamping portion 220. The protrusion 222 of the inner clamping portion 220 may be extended from a center point of the body portion 210 in a radius direction. Thus, the protrusion 222 may have a lower surface 224 exposed through the body portion 210. The lower surface 224 may have a slant shape. Particularly, a slant direction of the lower surface 224 may correspond to a direction in which a thickness of the protrusion 222 may be gradually decreased from the center point of the body portion 210 in the radius direction. Alternatively, the lower surface 224 may have a flat surface substantially parallel to an upper surface of the inner clamping portion 220.

The outer clamping portions 230 may be formed integrally with the side surfaces of the body portion 210. The outer clamping portions 230 may be extended from the side surfaces of the body portion 210 in a radial direction. At least one of the outer clamping portions 230 may have a side surface protruded from a side surface of the inner clamping portion 220 in the radius direction. The outer clamping portion 230 may be configured to clamp portions of the PCB 110 surrounding the central portion of the PCB 110 to the test head.

The outer clamping portion 230 may include at least four portions extended from corners of the body portion 210. Thus, the side surfaces of the body portion 210 and the side surfaces of the inner clamping portion 220 may be partially exposed. The outer clamping portions 230 may be spaced apart from each other by a substantially same angle. Alternatively, the outer clamping portions 230 may be extended from the four side surfaces of the body portion 210. Further, numbers of the outer clamping portions 230 may be two, three or at least five. At least one of the outer clamping portions 230 may have a wedge, or sector shape. Thus, the sector shaped outer clamping portion 230 may have two corners. Alternatively, the outer clamping portions 230 may have other shapes as well as the sector shape.

In order to affix the clamping apparatus 200 to the test head, at least one of the outer clamping portions 230 may have two fixing holes 234. The outer clamping portions 230 may be fixed to the test head by combining bolts with the fixing holes 234 through threads. Alternatively, as shown in FIG. 3B, at least one of the outer clamping portions 230 may have one fixing hole 234. Further, at least one of the outer clamping portions 230 may have at least three fixing holes 234.

According to example embodiments, the outer clamping portions 230 may be formed integrally with the body portion 210 so that connecting portions between the body portion 210 and the outer clamping portions 230 may be configured to make contact with the PCB 110. Therefore, the contact area between the clamping apparatus 200 and the PCB 110 may be increased to suppress the PCB 110 from being bent.

Figure 7:
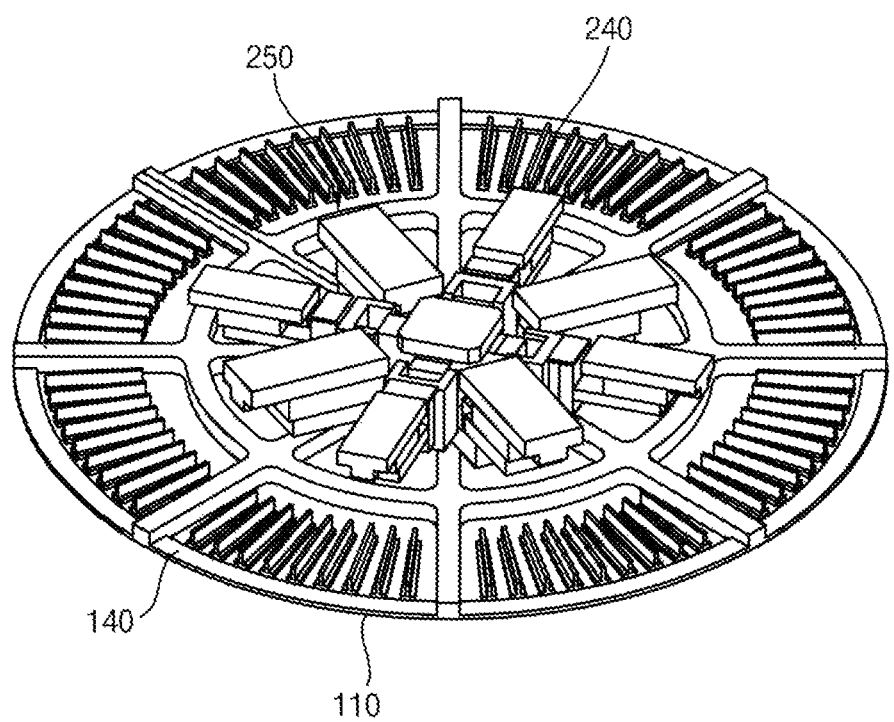
Figure 8:
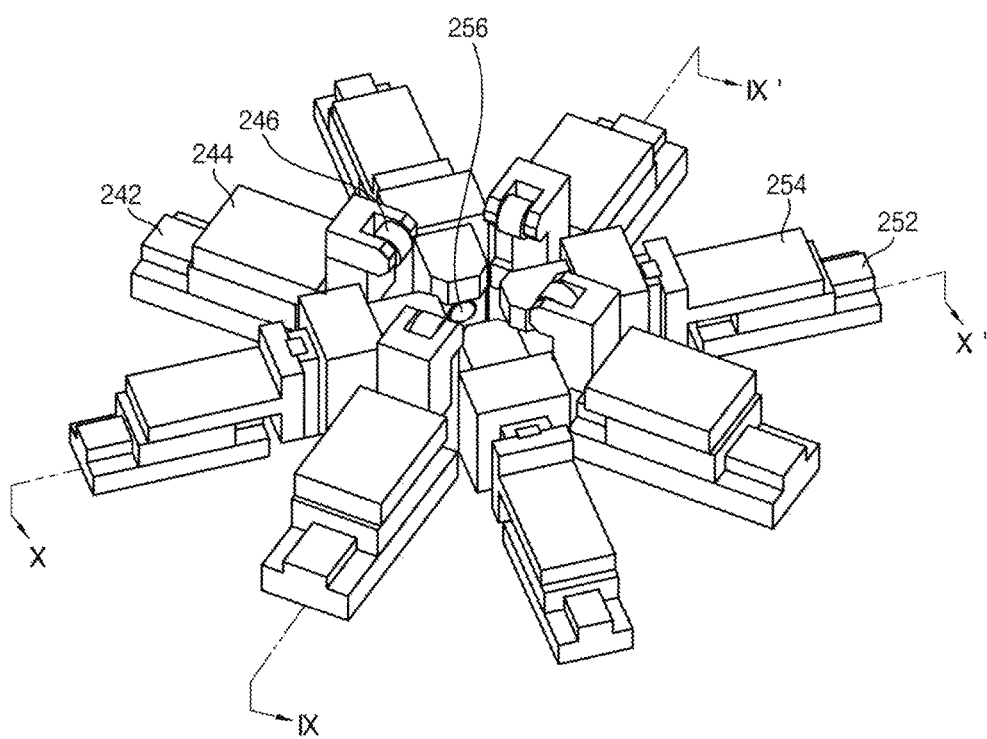
Figure 9:
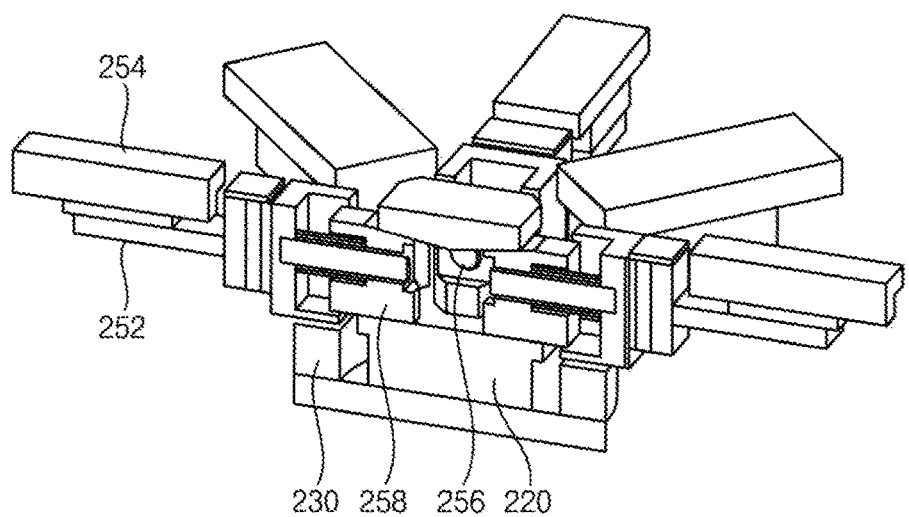
Figure 10:
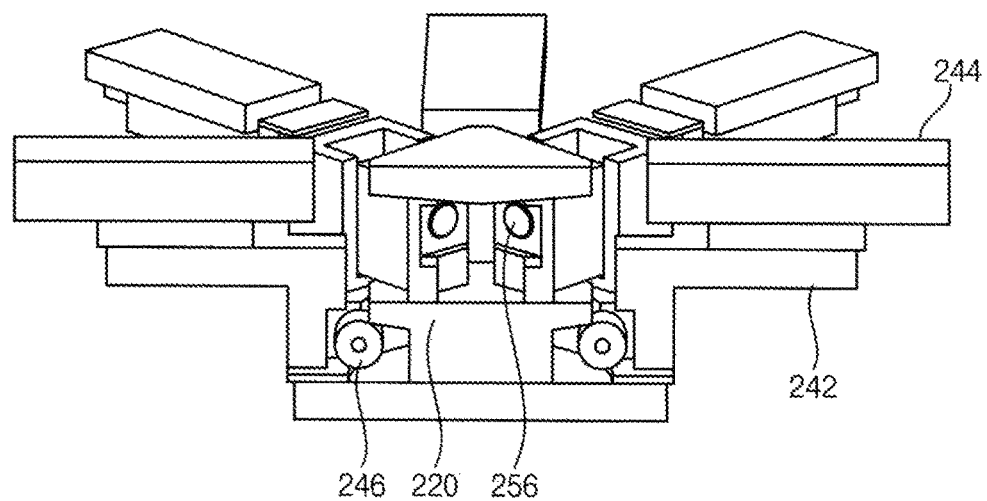

FIG. 7 is a perspective view illustrating the PCB clamped by the clamping apparatus in FIG. 2, FIG. 8 is a perspective views illustrating a bottom surface of the clamping apparatus in FIG. 7, FIG. 9 is a cross-sectional view taken along a line IX-IX' in FIG. 7, and FIG. 10 is a cross-sectional view taken along a line X-X' in FIG. 7.

Referring to FIGS. 7 to 10, the clamping apparatus 200 may further include a first clamping unit 240 and a second clamping unit 250. The first clamping unit 240 may be configured to affix the inner clamping portion 220 and the body portion 210 to each other. The second clamping unit 250 may be configured to affix the inner clamping portion 220 and the outer clamping portions 230 to each other. The first clamping unit 240 and the second clamping unit 250 may be provided to the test head. Thus, the PCB 110 may be clamped to the test head by fixing the body portion 210, the inner clamping portion 220 and the outer clamping portions 230 using the first clamping unit 240 and the second clamping unit 250.

The first clamping unit 240 may include a first rail 242, a first slider 244 and a clamping roller 246. The first rail 242 may be arranged between the outer clamping portions 230 in the radius direction of the body portion 210. The first slider 244 may be movably connected with the first rail 242. The first slider 244 may be moved along the first rail 242 by an actuator. The clamping roller 246 may selectively make contact with the slant lower surface of the inner clamping portion 220.

When the first slider 244 may be moved on the first rail 242 toward a central portion of the inner clamping portion 220, the clamping roller 246 may be moved toward the side surface of the body portion 210 through spaces between the outer clamping portions 230. The clamping roller 246 may be moved toward the side surface of the body portion 210 with making roll contact with the slant lower surface 226. The clamping roller 246 may closely make contact with an upper end of the side surface of the body portion 210 and an inner end of the slant lower surface 226 of the inner clamping portion 220 to affix the body portion 210 and the inner clamping portion 220 by the first clamping unit 240.

The second clamping unit 250 may include a second rail 252, a second slider 254 and a ball spring 256. The second rail 252 may be arranged in the radius direction of the body portion 210 toward the outer clamping portions 230. That is, the second rails 252 may be arranged between the first rails 242. The second slider 254 may be movably connected with the second rail 252. The second slider 254 may be moved along the second rail 252 by an actuator. The ball spring 256 may be installed at the second slider 254. The ball spring 256 may resiliently make contact with the side surfaces of the outer clamping portions 230. At least one of the outer clamping portions 230 may have a clamping groove 232 configured to receive the ball spring 256. The clamping groove 232 may be formed on the side surface of the outer clamping portion 230 in a circumferential direction.

The second clamping unit 250 may further include a clamping block 258. The clamping block 258 may be installed at the second slider 254. The clamping block 258 may be lifted by an actuator. The clamping block 258 may be configured to press and support the upper surface of the inner clamping portion 220. During the clamping roller 246 of the first clamping unit 240 may be moved along the slant lower surface 224 of the inner clamping portion 220, the clamping roller 246 may not be moved in a vertical direction. Thus, the inner clamping portion 220 may be upwardly moved by moving the clamping roller 246 toward the inner end of the slant lower surface 224 of the inner clamping portion 220. The clamping block 258 may press the upper surface of the inner clamping portion 220 to hinder or prevent the inner clamping portion 220 from being upwardly moved by the clamping roller 246.

Figure 11:
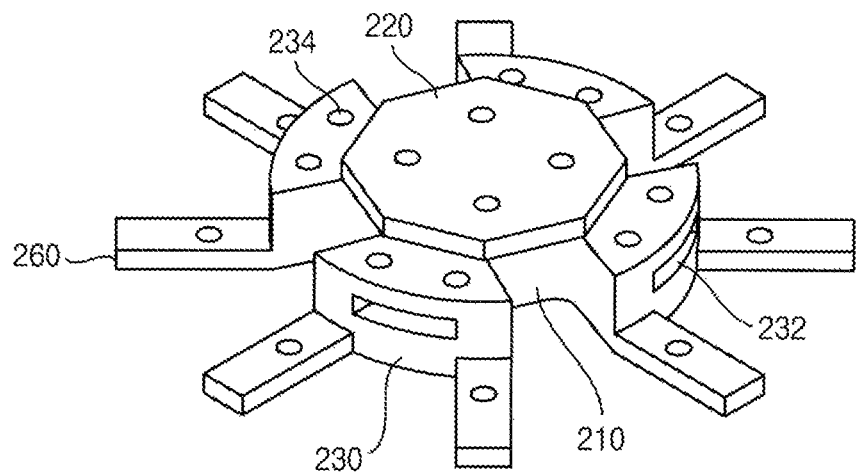
Figure 12:
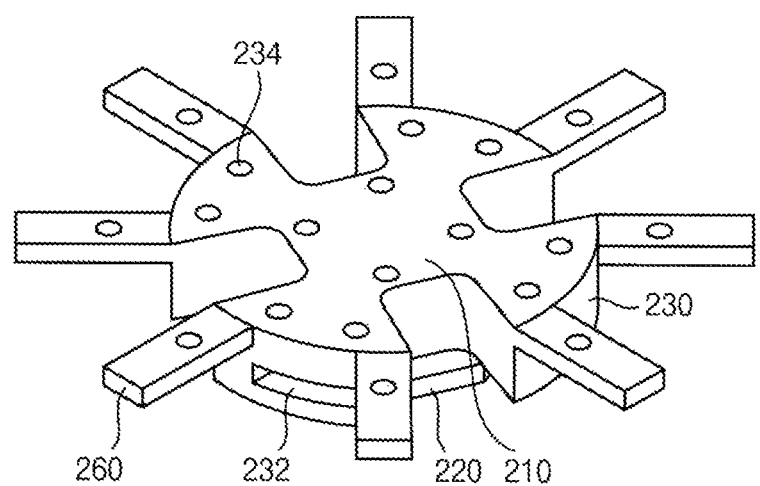

FIG. 11 is a perspective view illustrating a clamping apparatus for a probe card in accordance with example embodiments, and FIG. 12 is a perspective view illustrating a bottom surface of the clamping apparatus in FIG. 11.

A clamping apparatus of this example embodiment may include elements substantially the same as those of the clamping apparatus in FIG. 3 except for further including an auxiliary clamping portion. Thus, the same reference numeral may refer to the same elements and any further illustrations with respect to the same elements may be omitted herein for brevity.

Referring to FIGS. 11 and 12, the clamping apparatus of this example embodiment may further include a plurality of the auxiliary clamping portions 260. The auxiliary clamping portions 260 may be formed integrally with the side surfaces of the outer clamping portions 230. Thus, the inner clamping portion 220, the outer clamping portion 230, the body portion 210, and the auxiliary clamping portions 260 may be of one single piece. The auxiliary clamping portions 260 may be configured as to increase the contact area between the clamping apparatus and the PCB 110.

The auxiliary clamping portions 260 may be extended in the radius direction of the body portion 210. At least one of the auxiliary clamping portions 260 may include a pair of portions extended from the corners of the at least one of the sector-shaped outer clamping portions 230. Alternatively, at least one of the auxiliary clamping portions 260 may include one portion or at least three portions extended from the side surface of at least one of the outer clamping portions 230.

The auxiliary clamping portions 260 may be extended along the connection portions 144 of the stiffener 140. Thus, the auxiliary clamping portions 260 may be configured to make contact with upper surfaces of the connection portions 144 of the stiffener 140. In order to hinder or prevent the adjusting screws 146 of the stiffener 140 from being covered with the auxiliary clamping portions 260, at least one of the auxiliary clamping portions 260 may have a length shorter than a distance between the side surface of the outer clamping portion 230 and the adjust screw 146.

Figure 13:
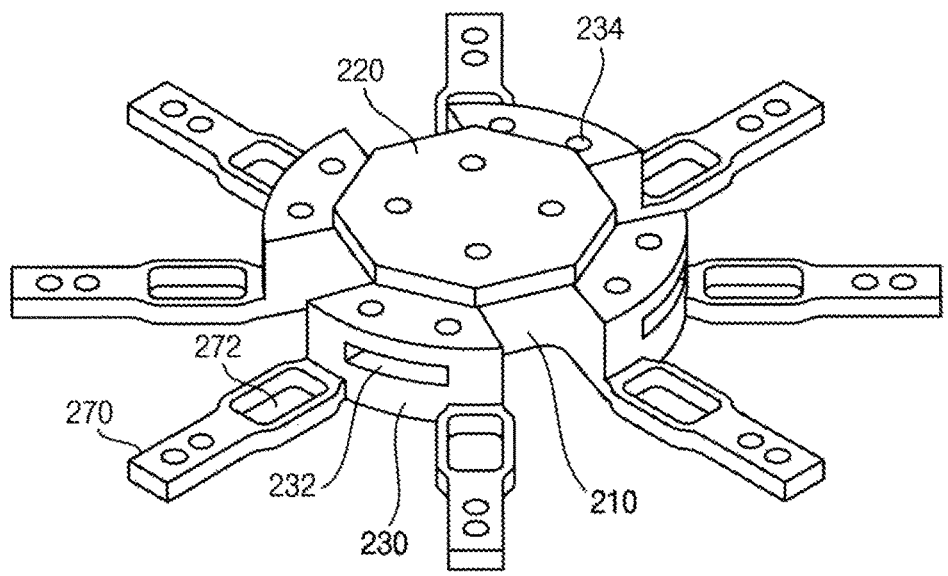
Figure 14:
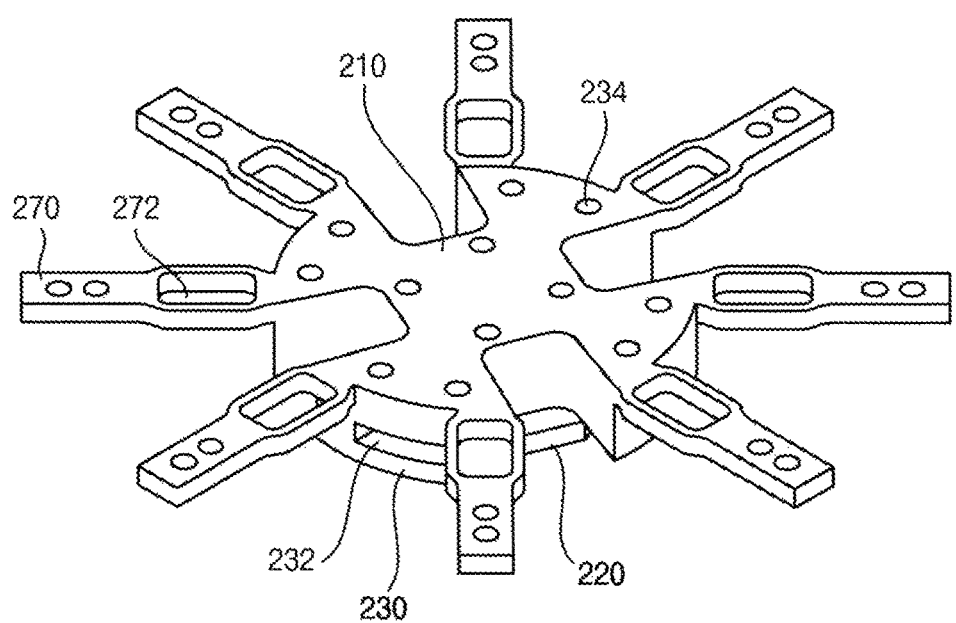

FIG. 13 is a perspective view illustrating a clamping apparatus for a probe card in accordance with example embodiments, and FIG. 14 is a perspective view illustrating a bottom surface of the clamping apparatus in FIG. 13.

A clamping apparatus of this example embodiment may include elements substantially the same as those of the clamping apparatus in FIG. 11 except for a shape of an auxiliary clamping portion. Thus, the same reference numeral may refer to the same elements and any further illustrations with respect to the same elements may be omitted herein for brevity.

Referring to FIGS. 13 and 14, an auxiliary clamping portion 270 of this example embodiment may have a length longer than the distance between the side surface of the outer clamping portion 230 and the adjust screw 146. The length of the auxiliary clamping portion 270 may be shorter than a length of the connecting portion 144 of the stiffener 140. Thus, because the length of the auxiliary clamping portion 270 may be longer than the length of the auxiliary clamping portion 260 in FIG. 11, a contact area between the clamping apparatus and the PCB 110 in this example embodiment may be wider than the contact area between the clamping apparatus and the PCB 110 in FIG. 11.

The auxiliary clamping portion 270 may be configured to cover the adjust screw 146. Thus, the auxiliary clamping portion 270 may have an opening 272 configured to expose the adjusting screw 146.

Figure 15:
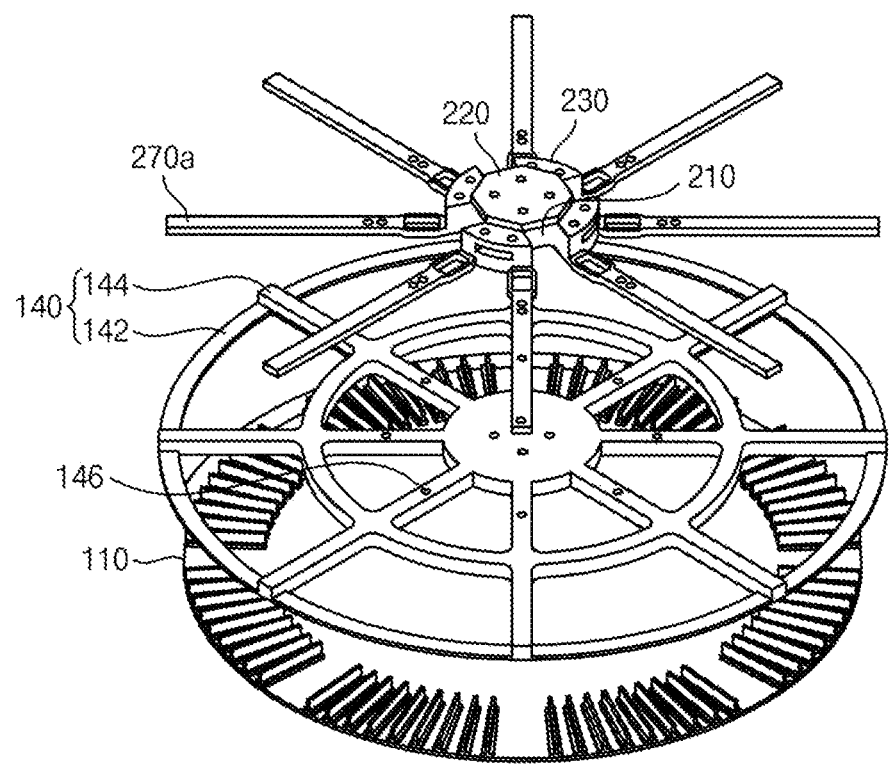

FIG. 15 is a perspective view illustrating a clamping apparatus for a probe card in accordance with example embodiments.

A clamping apparatus of this example embodiment may include elements substantially the same as those of the clamping apparatus in FIG. 13 except for a shape of an auxiliary clamping portion. Thus, the same reference numeral may refer to the same elements and any further illustrations with respect to the same elements may be omitted herein for brevity.

Referring to FIG. 13, an auxiliary clamping portion 270a of this example embodiment may have a length substantially the same as that of the connecting portion 144 of the stiffener 140. That is, the length of the auxiliary clamping portion 270a may be substantially the same as a radius of the stiffener 140.

Figure 16:
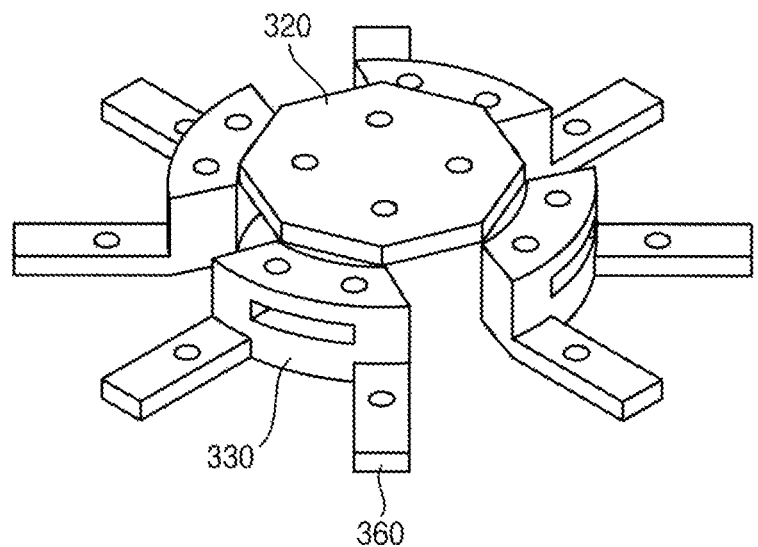
Figure 17:
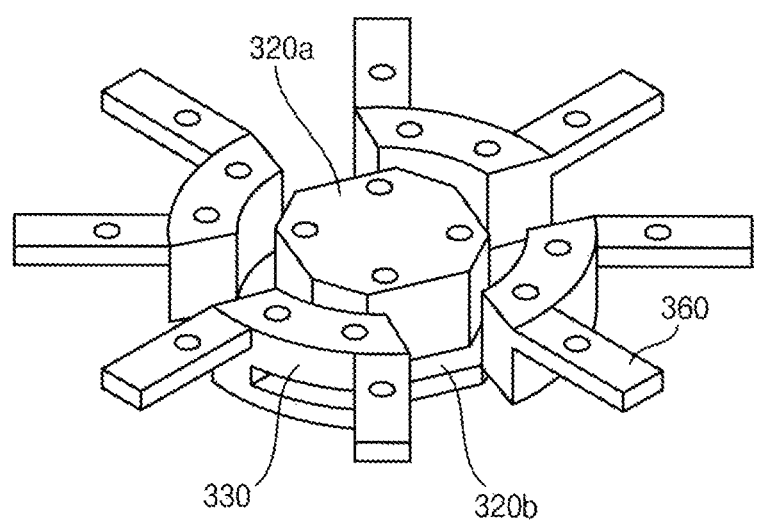

FIG. 16 is a perspective view illustrating a clamping apparatus for a probe card in accordance with example embodiments, and FIG. 17 is a perspective view illustrating a bottom surface of the clamping apparatus in FIG. 16.

Referring to FIGS. 16 and 17, a clamping apparatus of this example embodiment may include an inner clamp 320, an outer clamp 330 and a plurality of auxiliary clamps 360.

The inner clamp 320 may be configured to clamp the central portion of the PCB 110 to the test head. The inner clamp 320 may have a structure substantially the same as that formed by combining the inner clamping portion 220 with the body portion 210 in FIG. 3. Thus, the inner clamp 320 may have configurations substantially the same as those of the inner clamping portion 220.

The outer clamp 330 may have an annular shape configured to surround the inner clamp 320. The outer clamp 330 may be separated directly from the inner clamp 320. That is, the outer clamp 330 may not be directly connected with the inner clamp 320. The inner clamp 320 may have a polygon portion 320a and a cut-out portion 320b. The cut-out portion 320b may connect to the outer clamp 330.

The auxiliary clamps 360 may be extended from a side surface of the outer clamp 330 in a radius direction of the inner clamp 320. The auxiliary clamps 360 may be extended along the connecting portions 144 of the stiffener 140. Thus, the auxiliary clamps 360 may be configured to make contact with the upper surfaces of the connecting portions 144 of the stiffener 140. In order to hinder or prevent the adjusting screw 146 from being covered with the auxiliary clamps 360, at least of the auxiliary clamps 360 may have a length shorter than the distance between a side surface of the outer clamp 330 and the adjusting screw 146.

Figure 18:
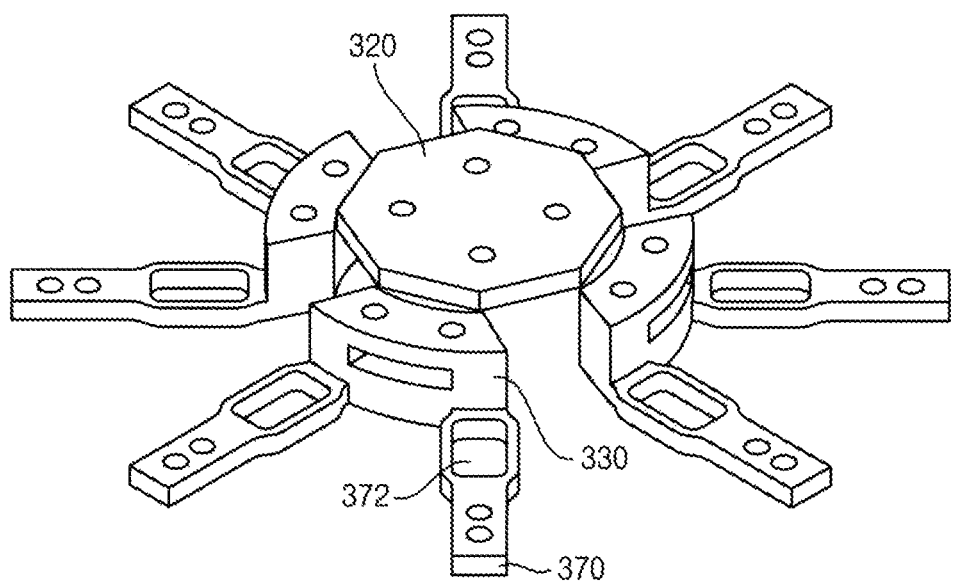
Figure 19:
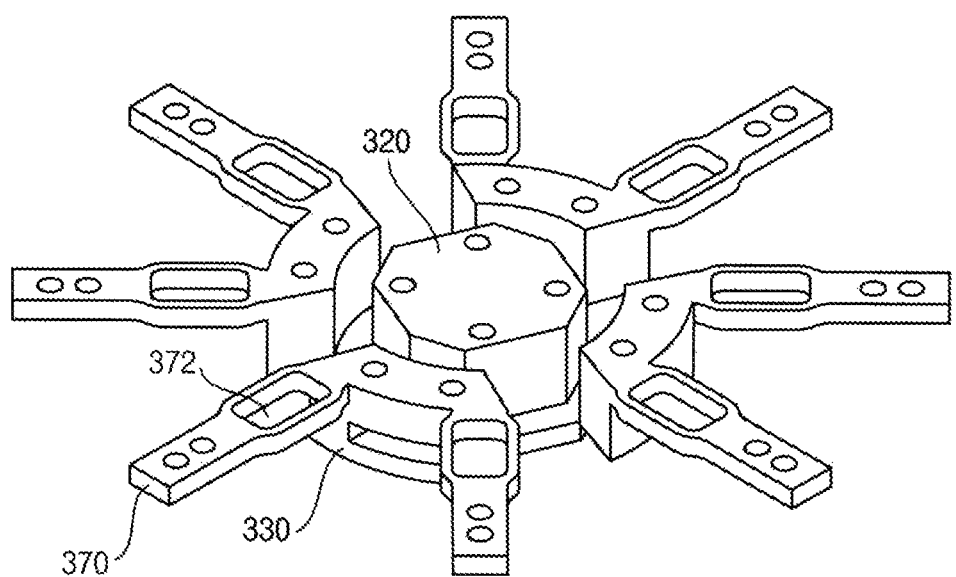

FIG. 18 is a perspective view illustrating a clamping apparatus for a probe card in accordance with example embodiments, and FIG. 19 is a perspective view illustrating a bottom surface of the clamping apparatus in FIG. 18.

A clamping apparatus of this example embodiment may include elements substantially the same as those of the clamping apparatus in FIG. 16 except for a shape of an auxiliary clamping portion. Thus, the same reference numeral may refer to the same elements and any further illustrations with respect to the same elements may be omitted herein for brevity.

Referring to FIGS. 18 and 19, an auxiliary clamp 370 of this example embodiment may have a length longer than the distance between the side surface of the outer clamp 330 and the adjusting screw 146. The length of the auxiliary clamp 370 may be shorter than a length of the connecting portion 144 of the stiffener 140. Thus, because the length of the auxiliary clamp 370 may be longer than the length of the auxiliary clamp 360 in FIG. 16, a contact area between the clamping apparatus and the PCB 110 in this example embodiment may be wider than the contact area between the clamping apparatus and the PCB 110 in FIG. 16.

The auxiliary clamp 370 may be configured to cover the adjusting screw 146. Thus, the auxiliary clamp 370 may have an opening 272 configured to expose the adjusting screw 146.

Figure 20:
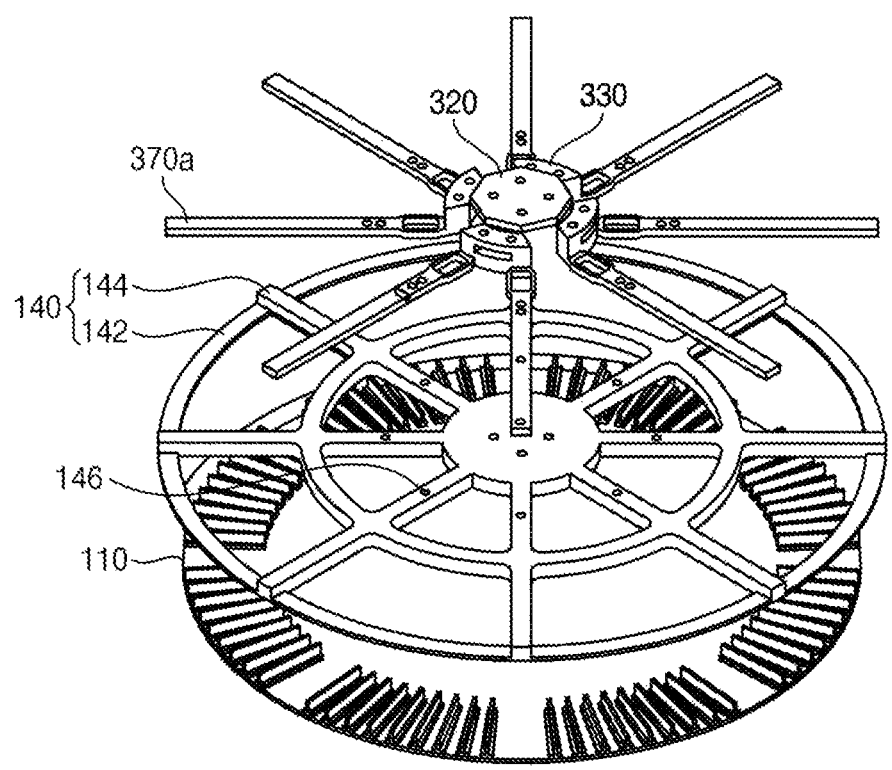

FIG. 20 is a perspective view illustrating a clamping apparatus for a probe card in accordance with example embodiments.

A clamping apparatus of this example embodiment may include elements substantially the same as those of the clamping apparatus in FIG. 18 except for a shape of an auxiliary clamping portion. Thus, the same reference numeral may refer to the same elements and any further illustrations with respect to the same elements may be omitted herein for brevity.

Referring to FIG. 20, an auxiliary clamp 370a of this example embodiment may have a length substantially the same as that of the connecting portion 144 of the stiffener 140. That is, the length of the auxiliary clamp 370a may be substantially the same as a radius of the stiffener 140.

According to example embodiments, the inner clamping portion and the outer clamping portions may be integrally formed with the body portion so that a contact area between the clamping apparatus and the PCB may be increased. Thus, bending of the probe card including the PCB may be suppressed to improve contacts between the object and the needles on the edge portion of the multi-layered substrate. As a result, a normal semiconductor chip may not be determined to be abnormal.

Figure 21:
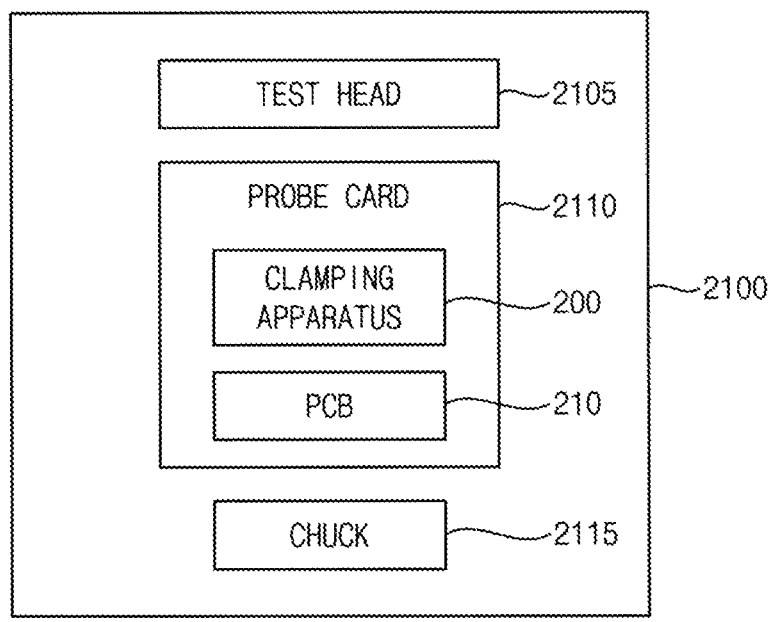

FIG. 21 is a block diagram of a testing apparatus in accordance with example embodiments.

Referring to FIG. 21, a testing apparatus 2100 configured to apply test currents from a test head to a wafer comprising semiconductor chips through a probe card may comprise a test head 2105, a probe card 2110 including a clamping apparatus 200 and a printed circuit board (PCB) 210, and a chuck 2115.

The chuck 2115 may support a substrate (not shown). The PCB 210 may be arranged between the test head and the semiconductor chip. The PCB 210 may include circuit patterns through which the test current may flow. The clamping apparatus 200 may be configured to affix the PCB 210 to the test head. The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. An apparatus configured to clamp a probe card, the apparatus comprising:
    a body portion configured to be between a printed circuit board (PCB) of the probe card and a test head;
    an inner clamping portion integrally formed with an upper surface of the body portion and configured to affix a central portion of the PCB to the test head;
    a plurality of outer clamping portions integrally formed with a side surface of the body portion configured to affix a portion of the PCB to the test head, the plurality of outer clamping portions configured to surround the central portion of the PCB; and
    a plurality of auxiliary clamping portions integrally formed with the body portion and extending from a side surface of at least one of the outer clamping portions, the plurality of auxiliary clamping portions configured to attach to a top surface of a stiffener of the probe card, and configured to be arranged between the test head and the stiffener.

2. The apparatus of claim 1, wherein the inner clamping portion includes a protrusion configured to protrude from the side surface of the body portion, the protrusion having a slant lower surface.

3. The apparatus of claim 2, wherein the inner clamping portion has a gradually decreasing thickness in a radius direction of the body portion.

4. The apparatus of claim 1, wherein the plurality of outer clamping portions are configured to radially extend from a center point of the body portion.

5. The apparatus of claim 1, wherein at least two of the plurality of outer clamping portions are spaced apart from each other by a substantially similar angle.

6. The apparatus of claim 1, wherein the plurality of auxiliary clamping portions are configured to radially extend from a center point of the body portion.

7. The apparatus of claim 1, wherein the plurality of auxiliary clamping portions have a length substantially the same as a radius of the stiffener.

8. The apparatus of claim 1, further comprising:
    a clamping roller inserted into spaces between at least two of the plurality of outer clamping portions, the clamping roller configured to clamp the side surface of the body portion; and
    a ball spring configured to clamp side surfaces of the plurality of outer clamping portions.

9. The apparatus of claim 8, further comprising:
    a clamping block configured to clamp an upper surface of the inner clamping portion.

10. The apparatus of claim 8, wherein at least one of the plurality of outer clamping portions has a clamping groove formed on the side surface of the outer clamping portion, the apparatus configured to receive the ball spring.

11. The apparatus of claim 1, wherein an upper surface of the inner clamping portion is not planar with an upper surface of the outer clamping portion.

12. A probe card comprising:
    a printed circuit board (PCB) configured to be between an object to be tested and a test head;
    a multi-layered substrate configured to be arranged between the PCB and the object to be tested;
    a plurality of needles provided to the multi-layered substrate and configured to make electrical contact with the object to be tested;
    a stiffener arranged between the PCB and the test head; and
    a clamping apparatus including,
        a body portion arranged between the PCB and the test head,
        an inner clamping portion integrally formed with an upper surface of the body portion to affix a central portion of the PCB to the test head,
        a plurality of outer clamping portions integrally formed with a side surface of the body portion to affix a portion of the PCB, which is configured to surround the central portion of the PCB, to the test head, and
        a plurality of auxiliary clamping portions integrally formed with the body portion configured to extend from a side surface of the plurality of outer clamping portions, configured to attach to a top surface of the stiffener, and arranged between the test head and the stiffener.

13. The probe card of claim 12, wherein an upper surface of the inner clamping portion is not planar with an upper surface of the plurality of outer clamping portions.

14. A clamping apparatus, the clamping apparatus comprising:
   a single piece including,
      a body,
      an inner clamping portion,
      a plurality of outer clamping portions, and
      a plurality of auxiliary clamping portions extending from a side surface of at least one of the plurality of outer clamping portions, the plurality of auxiliary clamping portions being configured to attach to a stiffener,
   the clamping apparatus being configured to clamp a probe card.

15. The clamping apparatus of claim 14, wherein at least one of the plurality of outer clamping portions includes,
   at least two fixing holes configured to affix the clamping apparatus to a test head.

16. The clamping apparatus of claim 14 wherein the plurality of outer clamping portions is configured to surround the inner clamping portion, and wherein the inner clamping portion includes,
   a polygon portion, and
   a cut-out portion connecting the plurality of outer clamping portions to the polygon portion.

17. The clamping apparatus of claim 14, wherein at least one of the plurality of auxiliary clamping portions includes an opening configured to expose adjusting screws.

18. The apparatus of claim 14, wherein an upper surface of the inner clamping portion is not planar with an upper surface of the plurality of outer clamping portions.

* * * * *